United States Patent [19]

Rachels

[11] Patent Number: 5,072,422
[45] Date of Patent: Dec. 10, 1991

[54] CONTENT-ADDRESSED MEMORY SYSTEM WITH WORD CELLS HAVING SELECT AND MATCH BITS

[75] Inventor: Kenneth W. Rachels, Plano, Tex.
[73] Assignee: E-Systems, Inc., Dallas, Tex.
[21] Appl. No.: 351,213
[22] Filed: May 15, 1989
[51] Int. Cl.$^5$ .......................... G11C 15/00; G06F 7/00
[52] U.S. Cl. ................... 365/49; 364/DIG. 1; 364/DIG. 2; 395/425
[58] Field of Search .......................... 365/49; 364/200 MS File, 900 MS File

[56] References Cited

U.S. PATENT DOCUMENTS

| | | | |
|---|---|---|---|
| 3,568,155 | 3/1971 | Abraham | 364/900 |
| 3,601,808 | 8/1971 | Vlack | 364/900 |
| 4,069,473 | 1/1978 | Vitaliev et al. | 365/49 |
| 4,221,003 | 9/1980 | Chang et al. | 365/49 |
| 4,254,476 | 3/1981 | Burrows | 365/49 |
| 4,296,475 | 10/1981 | Nederlof et al. | 365/49 |
| 4,341,929 | 7/1982 | Alexander et al. | 364/900 |
| 4,377,855 | 3/1983 | Lavi | 365/49 |
| 4,443,860 | 4/1974 | Vidalin | 365/49 X |
| 4,488,260 | 12/1984 | Cantarel | 365/49 |
| 4,559,618 | 12/1985 | Houseman et al. | 365/49 |
| 4,575,818 | 3/1986 | Almy et al. | 365/49 |
| 4,575,827 | 3/1986 | Kulakowski | 365/230.01 |
| 4,580,240 | 4/1986 | Watanabe | 365/49 |
| 4,622,653 | 11/1986 | McElroy | 365/49 |
| 4,625,295 | 11/1986 | Skinner | 364/900 |
| 4,663,742 | 5/1987 | Andersen et al. | 365/49 |
| 4,852,059 | 7/1989 | Oates | 365/49 |
| 4,928,260 | 5/1990 | Chuang et al. | 365/49 |
| 4,953,122 | 8/1990 | Williams | 364/900 |

FOREIGN PATENT DOCUMENTS

| | | |
|---|---|---|
| 0179992 | 11/1982 | Japan . |
| 0576609 | 10/1977 | U.S.S.R. . |
| 0746718 | 7/1980 | U.S.S.R. . |
| 0760187 | 8/1980 | U.S.S.R. . |
| 0963100 | 10/1982 | U.S.S.R. . |
| 1045272 | 9/1983 | U.S.S.R. . |
| 2182789 | 5/1987 | United Kingdom | 365/49 |

OTHER PUBLICATIONS

"A Content-Addressable Memory Cell with MNOS Transitors", Junnar Carlstedt et al., 10/73 Edition, IEEE Journal of Solid State Circuits, vol. SC-8, #5, pp. 338-343.

Primary Examiner—Stuart N. Hecker
Assistant Examiner—Michael A. Whitfield
Attorney, Agent, or Firm—Harold E. Meier

[57] ABSTRACT

A content-addressed memory system stores large amounts of data for quick access by keyword value combinations. The system comprises a controller and a plurality of content-addressed memory chips. Each chip comprises a plurality of word cells with logic to enable independent, parallel operation of each word cell, storage of a record of closely related data in more than one word cell, and accessing an entire record when data in one word cell is matched to the keyword value.

13 Claims, 4 Drawing Sheets

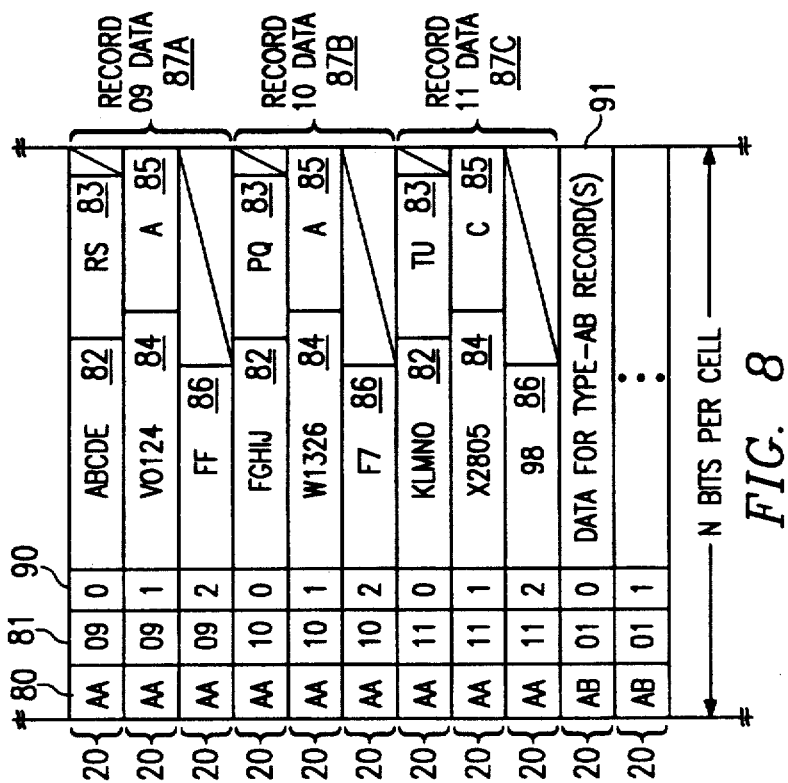
FIG. 7 (PRIOR ART)
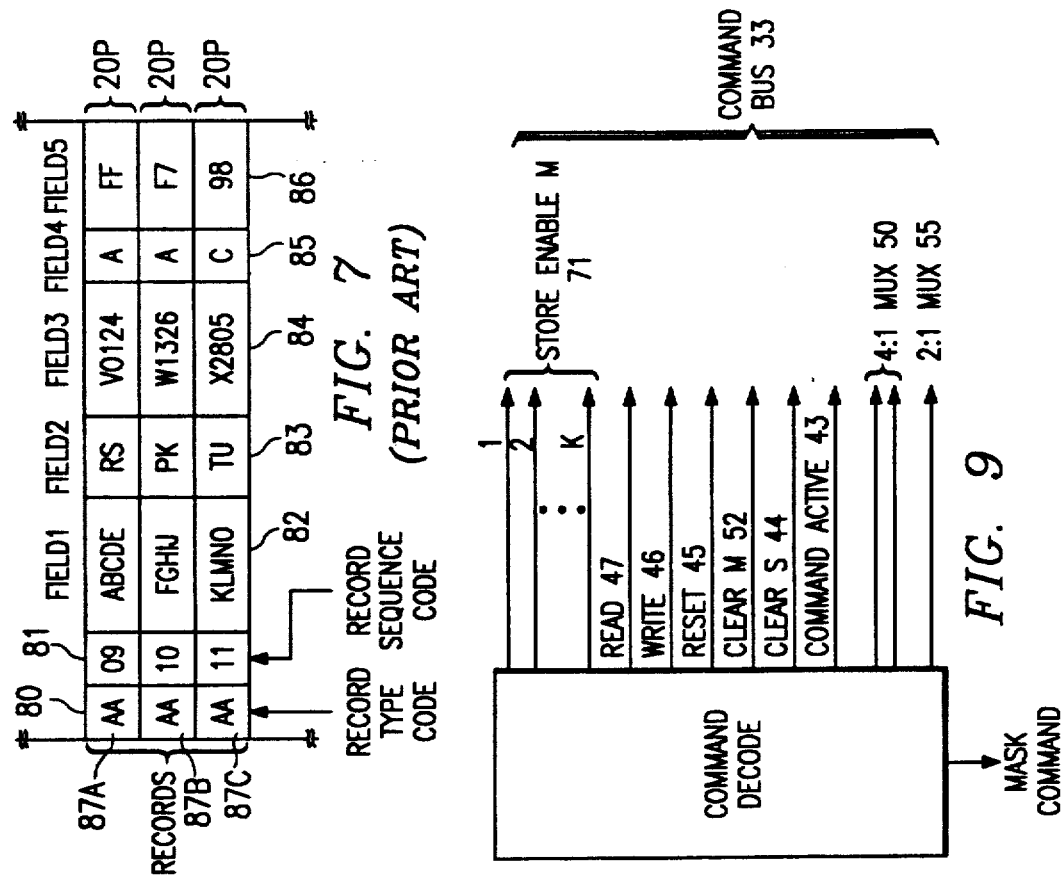
FIG. 8
FIG. 9

CONTENT-ADDRESSED MEMORY SYSTEM WITH WORD CELLS HAVING SELECT AND MATCH BITS

TECHNICAL FIELD

The present invention relates to electronic memory devices, and more particularly to content-addressed memories.

BACKGROUND OF THE INVENTION

Content-addressed memories, sometimes known as associative memories, are well known in the prior art. Whereas conventional location-addressable memory is designed to retrieve data from a specific address, a content-addressable memory system finds and retrieves a collection of closely related data, called a record, by comparing a keyword value known to be associated with or located within the desired data with the data stored in the content-addressed memory. Once a match is found, the rest of the record can be accessed. Thus, all records containing one or more of the keyword values will be found without any prior knowledge of where the records are stored.

Whereas any memory is searchable for keyword values by sequentially reading and matching the words in the memory with the keyword value, the records of a content-addressed memory are searched simultaneously and in parallel for a match. The word cells are arranged in parallel and share a common data bus so that the keyword value can be sent simultaneously to all the word cells. The speed with which a content-addressed memory finds all records matching a keyword value is, consequently, significantly faster.

For example, if a court's written opinion is a record of the content-addressed memory, it may be found by searching for the names of the parties in the suit. The names of the parties are the keyword values. The name of a party in this example is always stored in a particular area of the record, called a field or subfield; the name of the case is the value. Thus, a keyword value defines a particular field or subfield and a particular value. Only a particular area of all records stored in the content-addressed memories need, therefore, be searched and compared with a particular keyword value. Several keyword values, called keyword value combinations, may also be used to find the desired record or records.

A typical application of a content-addressable memory is a cache memory. Instead of having to retrieve data stored in a large main memory, frequently used data is stored in a smaller content-addressable memory, thus permitting quicker retrieval. Each word cell contains a record and a corresponding address in the main memory. With this address as a keyword value, the record is retrievable from the cache memory by asking it, in effect, for the record having that address, no matter where it is actually stored within the memory.

In storing and quickly retrieving large amounts of data, prior art content-addressed memories are presented with several physical limitations. In order to store large records, either the word cells need to be made very large, or the record must be stored in a separate "numbered-cell" storage where the keyword value is mapped to the address of the "numbered cell." The disadvantage of the first technique is that the size of the word cells are fixed and large, at least large enough to accommodate all the necessary values of its foreseeable use. Content-addressed memories, thus, must either be individually tailored to specific uses, making high-volume production techniques unavailable to reduce costs, or there will be wasted storage space. The numbered-cell technique, on the other hand, taxes the speed of the memory when more than one keyword value is used to retrieve a record. Instead of storing the entire record in the content-addressed memory, it is stored in a "numbered cell" memory, with the number, or address, of the cell stored in the content-addressed memory, along with a few selected keyword values. Once a match is made, the number, or address, of the record is read, and the record of interest is accessed. After a list of records satisfying a first keyword value is found, however, the records on the list are matched sequentially with other keyword values to find desired subsets of the matched records, since each record must be individually read and matched from the main memory. A significant time penalty is, thus, imposed for matching combinations of keyword values.

There is a need, therefore, for a content-addressed memory that permits the flexibility of storing records of any desired size and quickly accessing the records with keyword value combinations.

BRIEF SUMMARY OF THE INVENTION

According to the present invention, a content-addressed memory system is provided in which records are stored across more than one word cell, and in which each word cell operates in parallel for quickly accessing records with keyword value combinations.

The content-addressed memory system of the present invention comprises a controller, such as a microcomputer, and a selectively large array of content-addressed memory chips. Each memory chip is divided into word cells. The word cells are connected in parallel so as to permit the keyword value to be matched against the contents of every word cell simultaneously. Each word cell contains a predetermined number of bits for data storage and also contains a select bit for indicating when a match has been made between a keyword value and a value stored within the cell. Any number of contiguous word cells can be chosen to store the records, thus providing for the flexibility and cost-efficiencies absent in other content-addressed memories. Once a value in a word cell is matched to the keyword value, the logic circuitry associated with the word cell or with the controller opens access to any word cell containing any of the record.

Each word cell may also contain one or more match bits that contain the value stored in the select bit or, if more than one, the value stored in a contiguous match bit. The match bits effectively number the results of prior comparisons, thus permitting several comparisons of different keyword values without having to access the data stored in the word cells after each comparison of a keyword value.

A brief description of the functioning of the preferred embodiment facilitates understanding of the invention. It will be appreciated that the true scope of the invention is not limited by the following description.

Records of the same type are stored across a predetermined number of adjacent word cells. Each of these records are comprised of a number of fields, each field corresponding to a specific location in one of the word cells. A keyword value is matched against a specified field or subfield by "masking" all the bits in each word cell except for those corresponding to the field or subfield. The keyword value is simultaneously sent to all word cells for comparison and matching. If there is a match, the select bit for the particular word cell is "turned on" to indicate the match. Only when the select bit of a word cell is turned on may data be read from and written into the word cell.

To access the remainder of a record selected from the other word cells storing parts of it, the select bit is shifted by a "previous" operation to the first word cell containing the record, allowing it to be read if desired. The bit may also be shifted to the next word cell containing the record, if necessary, using a "next" operation, and continues to be shifted until the entire record is accessed.

Each word cell also has associated with it at least one match bit. A match bit contains whatever value is stored in the select bit. With the match bit, for example, several keyword value searches can be made without actually accessing the data stored in a matched word cell. Thus, records are identified and found with combinations of keyword values. The match bit "remembers" whether the word cell was selected in the previous search, which then permits the select bit to be reset prior to every new search yet permit the word cell to remember the results of the previous search. Several match bits may be used to remember the results of several searches with keyword values. When the data in the word cell is to be accessed, all bits except the match bits, for example, may be masked with the select bit "turning on" if there is a match between data stored in the match bits and a keyword value that is matched against the match bits. For example, a word cell has three match bits, and out of three keyword values, the word cell has been matched to the first and last keyword values, the match bits would contain logic "1,0,1." If the desired word cell is the one matching the first and last keyword- values, then all the data bits would be masked and a keyword value of "1,0,1" would be matched against the data stored in the match bits of every word cell, with the present word cell signalling that it has been selected.

Another feature of the preferred embodiment of this invention is that the content-addressable memory chip possesses the logic necessary to carry out all of the functions of storing and retrieving records of data with relatively simple commands from the controller or microprocessor. Each word cell on the memory chip is an independent processor that functions in parallel with all other word cells on the same chip and on other chips. A very large amount of data is, thereby, quickly searched and accessed with only keyword values and a few control signals without the necessity of the controller issuing commands forever.

Thus, this invention provides a means of storing large amounts of data and quickly accessing it by keyword value combinations.

This invention also provides a content-addressed memory with fixed word cell size that accommodates most record sizes.

The present invention further provides a means to operate each word cell on a content-addressed memory chip in parallel.

In addition, the invention provides a means to perform logical operations necessary for comparing keyword value combinations to each word cell on a single microchip.

BRIEF DESCRIPTION OF THE DRAWINGS

For a more complete understanding of the present invention and the advantages thereof, reference may be made to the following description taken in conjunction with accompanying drawings in which:

FIG. 7 is a representation of the prior art method of storing records in prior art content-addressed memory cells;

FIG. 8 is a representation of one example of the method of storing records in the content-addressed memory cells of the present invention; and FIG. 9 is a block representation of the command decode and command bus.

DETAILED DESCRIPTION OF THE DRAWINGS

Figure 1:
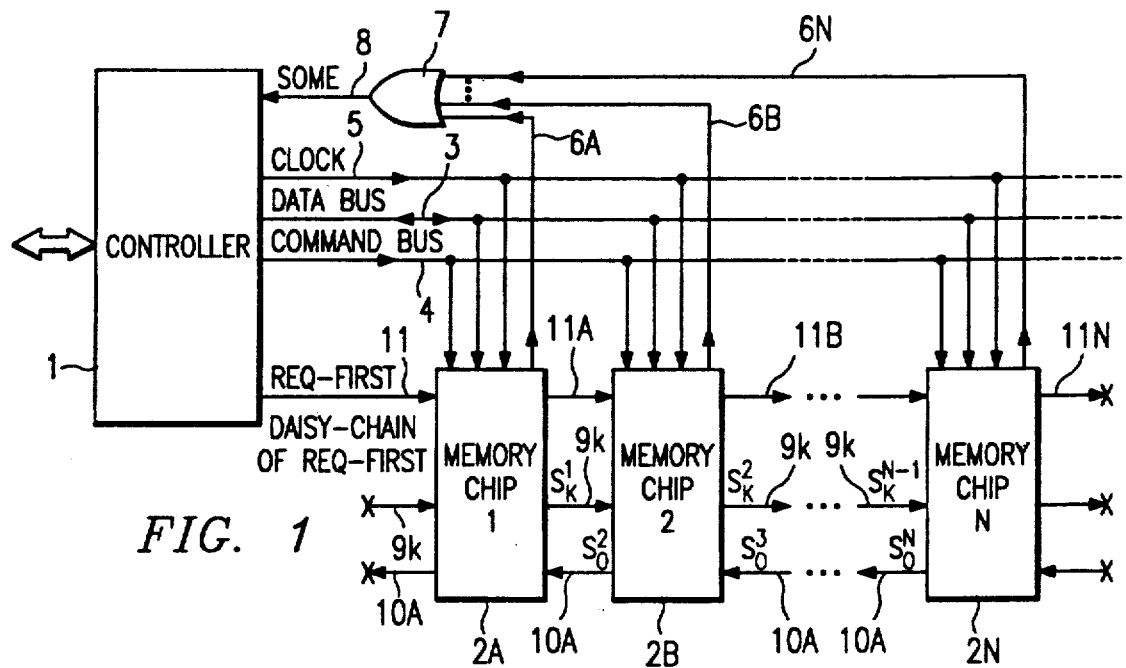
FIG. 1 is a block diagram representing an overview of the content-addressed memory system, including a controller and a plurality of content-addressed memory chips.

As shown in FIG. 1, the content-addressed memory system is comprised of a controller 1 and a plurality of content-addressed memory chips 2A-2N. The controller 1 may be a general-purpose microcomputer and may also be a user of the data stored in the content-addressed memory chips. Although not shown in FIG. 1, additional memory chips may be added in serial to each memory chip 2A-2N so as to form parallel chains of content-addressed memory chips constituting an indefinitely large array of content-addressed memory chips. Parallel chains reduce signal propagation delays in a system with a very large number of content-addressed memory chips. The content-addressed memory chips 2A-2N are coupled to controller 1 through a shared data bus 3, a command bus 4, and a clock line 5 so that clock signals, data and commands may be sent simultaneously to all of the content-addressed memory chips.

Figure 2:
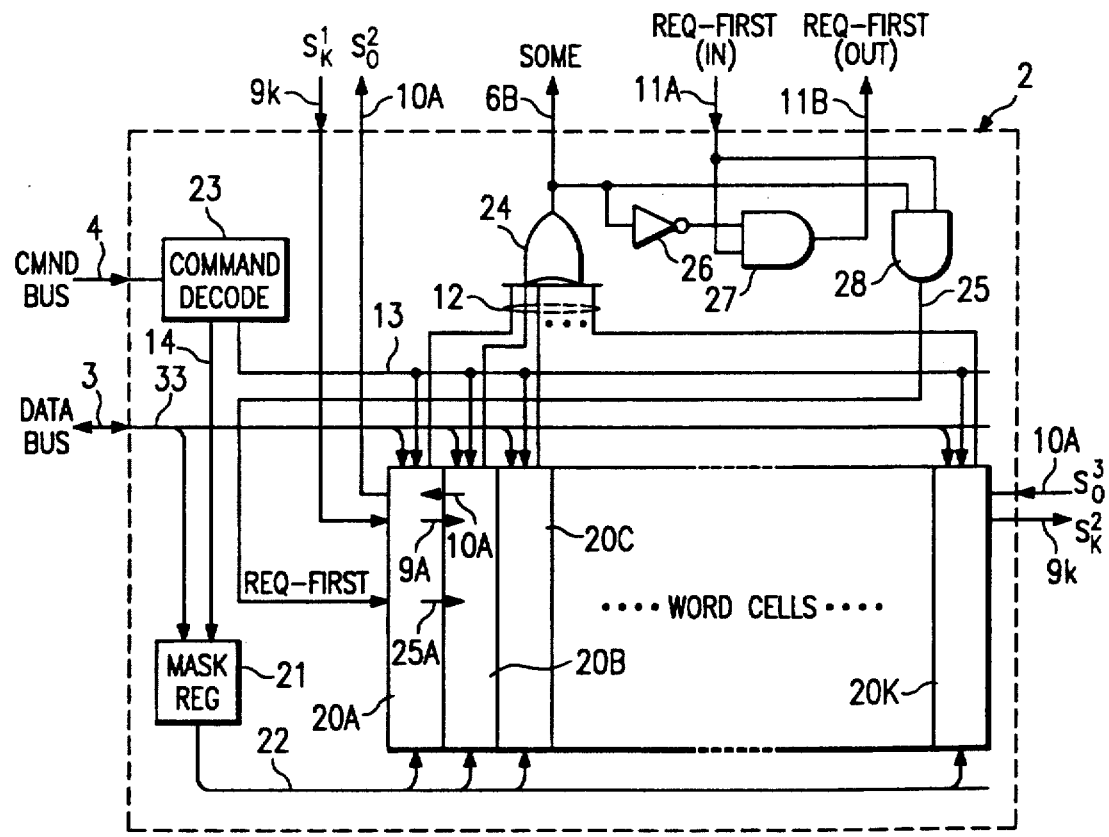
FIG. 2 is a block representation of the internal components of a content-addressed memory chip.
Figure 4:
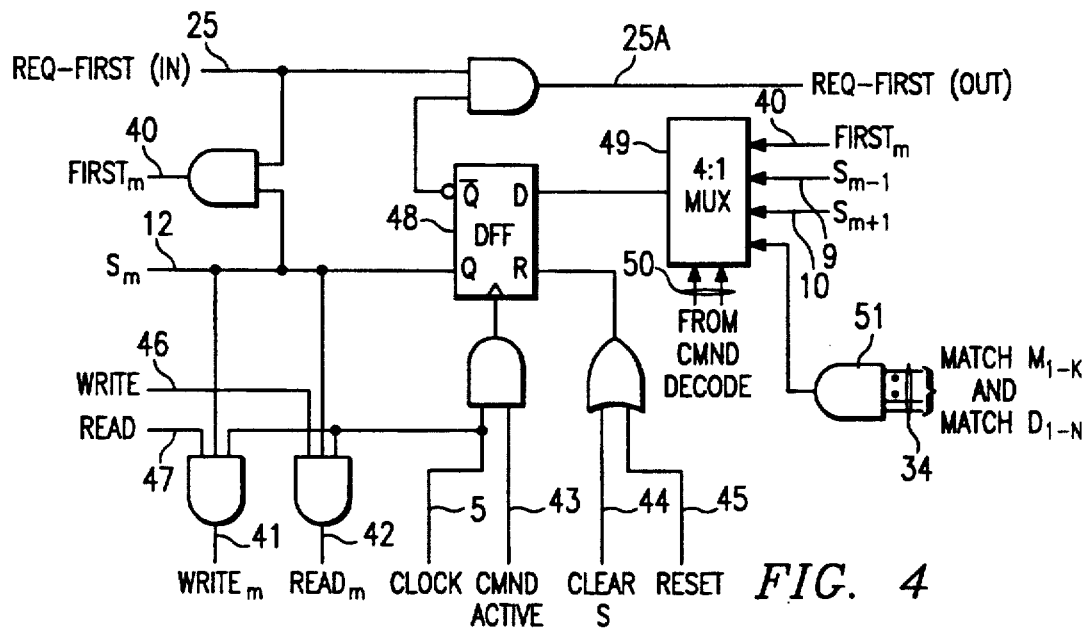
FIG. 4 represents the logic circuitry for implementing the functions of the select bit of a memory cell.
Figure 5:
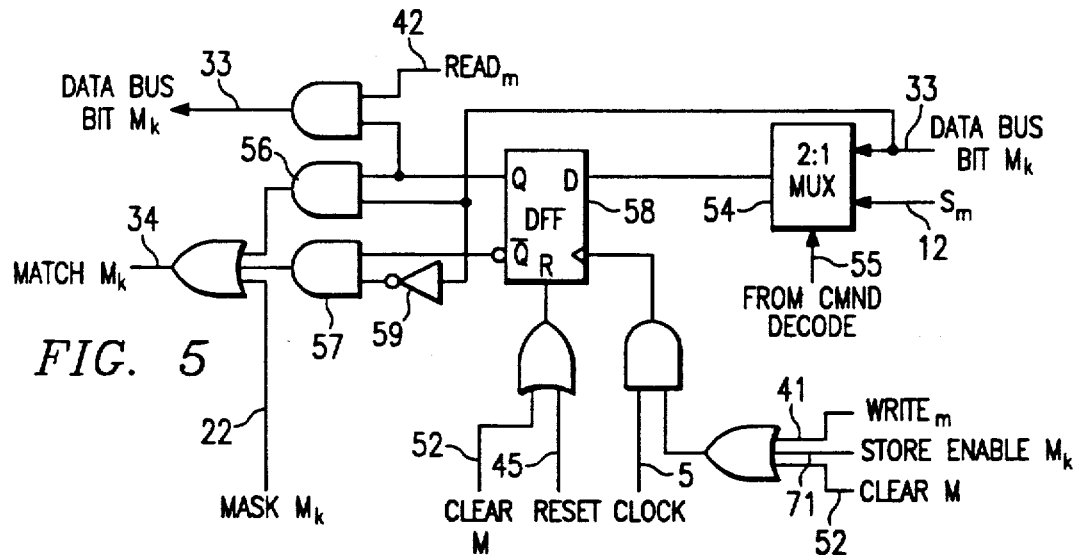
FIG. 5 represents the logic circuitry to implement the functions of the match bit for a memory cell.
Figure 6:
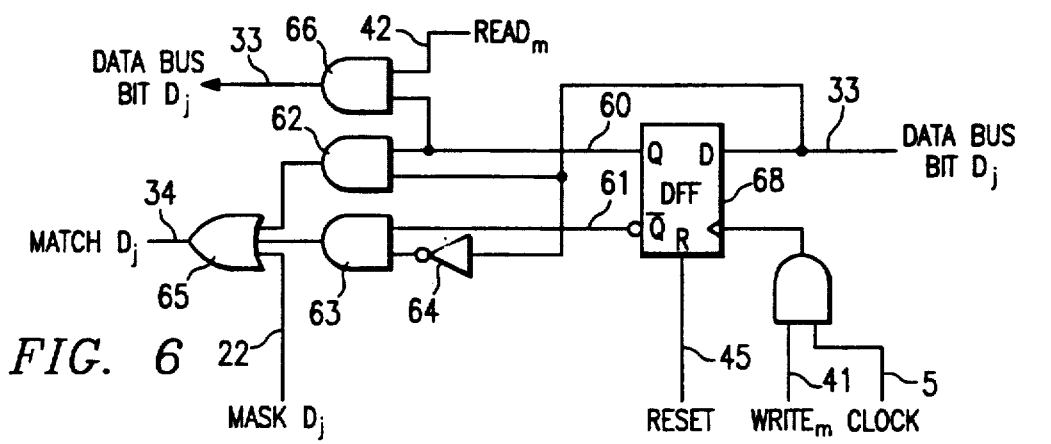
FIG. 6 represents the logic circuitry to implement the functions of a data bit of a memory cell.

As shown in FIG. 2, each content-addressed memory chip 2A-2N is comprised of a large number of word cells 0A-20K which are connected in parallel to the multi-channel shared data bus 3. In order to allow the use of data word cells with a large number of bits, data pins on each content-addressed memory chip 2A-2N, to which the data bus 3 and the internal data bus 33 are connected, may be multiplexed. The data bus 3 is also connected to mask register 21 through internal data bus 33, which in turn is connected in parallel by mask bus 22 to each word cell 20A-20K. The command bus 4 is connected to the command decode module 23, which, in turn, is connected to mask register 21 and to word cells 20A-20K. The details of the control lines are shown in FIGS. 4-6, which will be discussed later.

Figure 3:
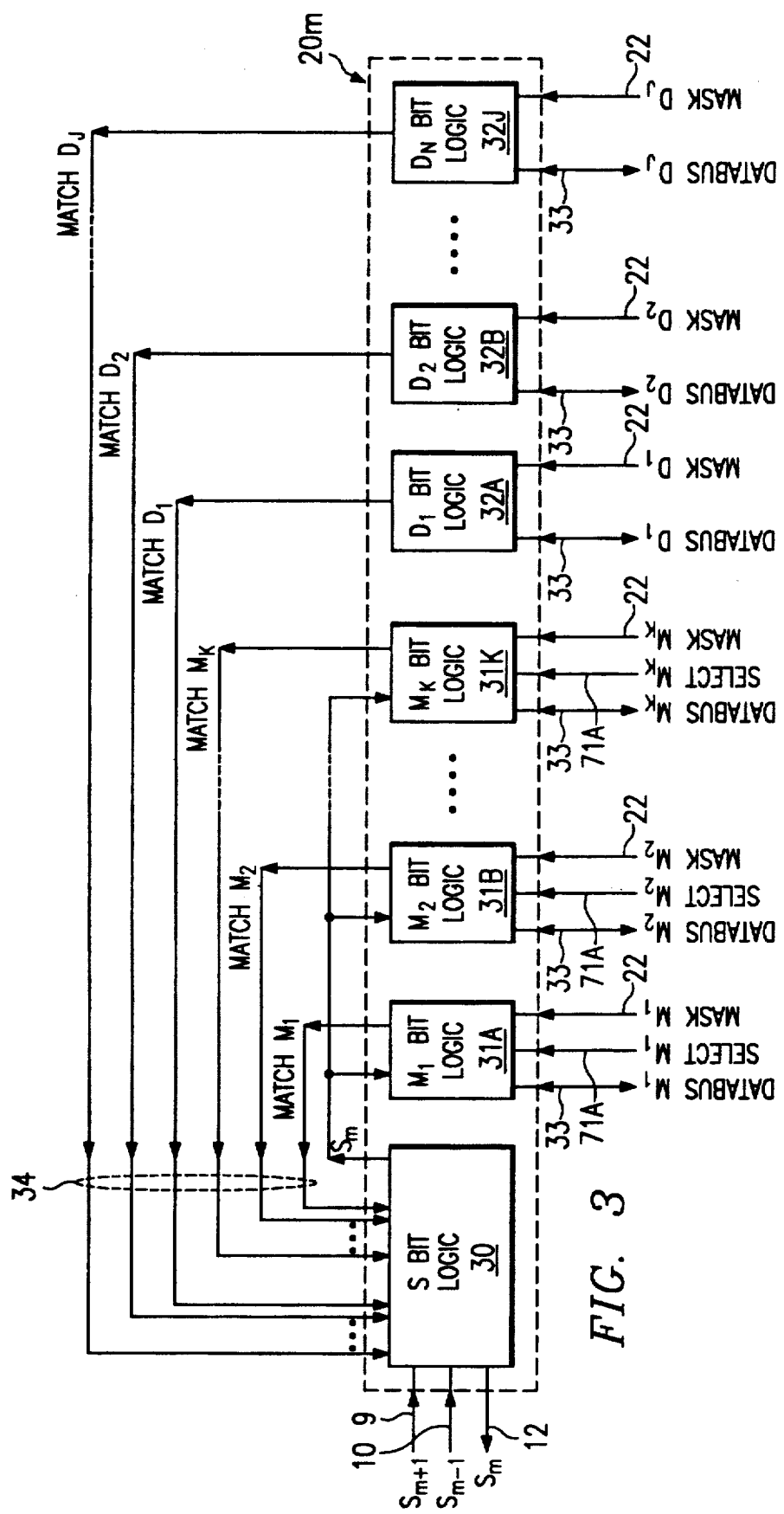
FIG. 3 is a block diagram representing the internal configuration of word cell located within a content-addressed memory chip.

As shown in FIG. 3, each word cell is comprised of a select bit 30, at least one match bit 31A-31K, and a plurality of data bits 32A-32J. In the preferred embodiment, there are three match bits and 64 data bits. Every match bit 31A-31K and every data bit 32A-32J is connected through internal data bus 33 to the shared data bus 3 to permit the reading, writing and selection of data stored in the bit. Each match bit and data bit is also connected to the logic for the select bit 30 through lines 34. As shown in FIGS. 2 and 3, the select bit of each word cell 20A-20K is connected by a line 9 and a line 10 to the select bits of the adjacent word cells. As shown in FIG. 2, the output of the select bit 30 of each cell, the logic value stored by the select bit appearing thereon, is connected to OR gate 24 through a $S_m$ line 12. Each match bit 31A-31K and data bit 32A-32J in each word cell is connected in parallel to mask register 21 through bus 22.

FIG. 7 is a representation of how prior art content-addressed memories store more than one record of data. Each record 87A-87C is stored in a single word cell 20P. The first data bits will store a record type code 80, indicating the type of record stored. There is also stored a record sequence code 81. Each record is divided into 20 data fields. The remainder of the data bits store data fields 82-86. As shown, a particular field of a particular record type is always stored in a particular place within a word cell. The record type is, thus, a short-hand indication of the arrangement of data fields within that particular record.

FIG. 8 is a representation of one example of how records of data may be stored in the present invention. Each word cell 20 has N data bits. The first data bits typically store a record type code 80, a record sequence code 81, and a cell sequence code 90. Each record 87A-87K is shown to be stored over three adjacent word cells 20. Any number of word cells, however, can be chosen to store a record depending on the number of data bits 32 there are in each word cell 20 and the size of the records. The same fields 82-86 are shown within each record, as in FIG. 7, except that fields 82 and 83 are shown to occupy certain locations in the first word cell of the record, fields 84 and 85 are shown in different locations in the next word cell, and field 86 at yet another location in the next word cell Thus, for example, field 86 will always be located at the same place in each word cell having a record type code 80 of "AA" and a cell sequence code 90 of "2." It is, therefore, possible to configure the content-addressed memory to accommodate any type of record by choosing the number of word cells 20 to store the record and the location of the fields of the record within each word cell. With knowledge of a keyword, which may vary from a single data bit of a field to the entire record depending on the configuration of word cells and fields, and the type(s) of record(s) in which the keyword can be found, the data bits within the word cells to which the keyword value is to be matched are known. If the data bits are matched to the keyword value, the record containing the matched keyword value is also said to be matched.

FIGS. 4-6 are the schematic diagrams of the logic for the select bit, a match bit and a data bit of the content-addressed memory system of the present invention representing the preferred embodiment. As shown in FIGS. 4-6, the select, match and data bits of each word cell has associated with it the necessary circuitry on the chip that enables it to function independently with simple commands from the controller. Each word cell is, in effect, an independent processor. It should be appreciated, however, that it would also be possible for the word cells on the chip to share on-chip logic circuitry or off-chip logic circuitry, such as the controller, but with a loss of true independent function. Furthermore, logic components other than those shown may be used to implement the same logical functions. It should be appreciated, therefore that the logic components shown in FIGS. 4-6 are but one of many possible implementations of the logic functions of the independent processor for each cell to enable each word cell to function independently when supplied with data and appropriate command signals.

The record of data is stored in the data bits 32A to 32K of the word cell. FIG. 6 represents the logic for processing data bit $D_j$. Similar logic will process each of the other data bits. D flip-flop 68 effectively stores the value of the bit $D_j$ input from the internal data bus when both the $WRITE_m$ line 41 and clock line 5 are on. The stored value appears on the Q output line 60, and its complement on output line 61. This arrangement permits the bit $D_j$ line of internal data bus 33 to be available for matching data contained in data bit $D_j$ any time the $WRITE_m$ line 41 is not on. The bit $D_j$ value is ANDed with the value on the Q output line 60 in an AND gate 62 If the value contained in data bit $D_j$ is a logic 1, and the Q output line is a logic 1, the output of AND gate 62 will be a logic 1. The logic value of the signal on the bit $D_j$ line of internal data bus 33 is also inverted at inverter 64 and ANDed with the complement of Q on the output line 61 in an AND gate 63 so that a logic 0 in the D flip-flop may be matched to a logic 0 on the internal data bus 33. Thus, with logic gates 62-64, a match between the data represented in bit $D_j$ and the data appearing on bit $D_j$ line of internal data bus 33 is indicated by a logic 1 on the MATCH $D_j$ line of match lines 34.

The data value contained in data bit $D_j$ will also be read when the $READ_m$ line 42 is activated by ANDing the Q output on line 60 at AND gate 66 with the $READ_m$ line, with the output indicating a logic 0 or 1 corresponding to the value on Q output line 60. The output of the AND gate 66 is connected to the bit $D_j$ line of internal data bus 33.

When matching keyword values, all data bits except those corresponding to the keyword are masked so that they indicate a match even when there is no match. Masking is done by ORing the MASK $D_j$ line of mask bus 22 with the output of AND gates 62 and 63 in an OR gate 65. For example, if the keyword of interest is Field 83 of FIG. 8, all data bits of every word cell are masked except for those which store or could store data in Field 83. Thus, all data bits that are masked will show logic 1 on the MATCH $D_j$ line of match lines 34. When the value stored in the unmasked data bits matches the keyword value on the appropriate bit lines of internal data bus 33, the match lines for every data bit 32A-K in the word cell will indicate a logic 1, thereby indicating a match of the keyword value with that word cell. As will be explained in connection with FIG. 5, the match bits 31A-31K must also be masked.

FIG. 4 shows the logic for the select bit 30 to indicate a match. The match lines 34 for every data bit and match bit are ANDed with the AND gate 51. The ANDed value on the output line from the AND gate 51 for each of the data bits having a logic 1 indicates a match. The ANDed value from the AND gate 51 appears on the input terminal of a 4-to-1 multiplexer 49. Also, input to the multiplexer 49 is a 4-to-1 MUX control 50 on command bus 13 to select one of the four inputs to the multiplexer 49. When matching keyword value data, the multiplexer 49 connects the output of the AND gate 51 to the D input of D flip-flop 48. When both the COMMAND ACTIVE line 43 and the clock line 5 are on, the COMMAND ACTIVE line being on whenever the 4-to-1 MUX control is active, the ANDed value from the AND gate 51 is then stored in the D flip-flop, with that value then appearing on the $S_m$ line 12. A logic 1 appearing on the $S_m$ line indicates a match for that word cell. A word cell is said to be selected when the select bit on $S_m$ line 12 is a logic 1.

Once a word cell is selected, it may be read from and written to. Read and write commands from the command decode 23 are sent to every select bit logic by activating READ line 47 or WRITE line 46 on command bus 13. For example, if the data in the word well is to be read, the $S_m$ line 12 must be a logic 1 and the READ line 47 must be a logic 1. The READ$_M$ line 42 is then activated with the clock signal on line 5 and, as previously described in connection with FIG. 6, causes the data stored in data bits 32A-32K and, as will be described in connection with FIG. 5, the match bits 31A-31K to appear on the data lines 33. The WRITE command on WRITE line 46 functions similarly to cause data on the data lines 33 to be written in a word cell, as previously described in connection with FIG. 6.

The multiplexer 49 also functions to connect the $S_{m-1}$ line 9, the $S_{m+1}$ line 10 or the FIRST$_m$ line 40 to input D of the D flip-flop 48. The values on the $S_{m-1}$ and the $S_{m+1}$ lines are the values on line 12 for the select bits of adjacent word cells, called the previous and next word cells. The value on the FIRST$_m$ line 40 is the ANDed value of the $S_m$ line 12 and the REQUEST-FIRST(IN) line 11.

Because a word cell is only available to be read or written when selected, multiplexing the next and previous select bits permits accessing all the word cells containing a record, once a word cell containing that record has been selected, by, in effect, sequentially shifting the select bit to each word cell in the record and accessing its stored data one at a time. To read the entire record of interest from all the word cells containing the record, the multiplexer 49 connects the $S_{m-1}$ line 9 or the $S_{m+1}$ line 10 to the D input of D flip-flop 48. The value on the connected line is, upon the clock signal of line 5, clocked into the D flip-flop 48. The COMMAND ACTIVE line 43 being on when multiplexer command lines 50 are active. Thus, for example, if the matched keyword value is found in the second of three word cells containing the record, the data stored in the select bit of the second word cell is shifted to the first word cell, the previously unselected word cell now being selected, and the data stored in select bit of the unselected third word cell is stored in the second, rendering the second word cell unselected. The first word cell can be now written into or read. This is called the SELECT PREVIOUS operation. With a SELECT NEXT operation, the select bit will be successively shifted down to the second and then to the third word cell containing the record, permitting writing to and reading from the word cell selected.

There is always the possibility that more than one word cell is matched. If reading or writing into a record is desired after a match, the REQUEST-FIRST(IN) line 11A is turned on. As shown in FIG. 2, if one of the word cells on the chip is selected, the SOME line 6 is turned on. When the REQUEST FIRST(IN) line 11A is turned on and a word cell on the chip is selected, the REQUEST-FIRST(OUT) line 11B, which goes to the other chips as a REQUEST-FIRST(IN) line, is turned off by inverting SOME line 6 in inverter 26 and ANDing it at AND gate 27 with REQUEST-FIRST(IN) line 11A. The SOME line 6 and REQUEST-FIRST(IN) line 11 are also ANDed at AND gate 28, with REQUEST-FIRST line 25 turning on if both input lines are on.

Each word cell has similar "daisy-chain" circuitry, as shown in FIG. 4, so that the FIRST$_m$ line 40 of the first word cell selected is turned on by the ANDing of the $S_m$ line 12 and the REQUEST-FIRST(IN) line 25. The REQUEST-FIRST(OUT) line 25A is then turned off, effectively turning off all FIRST$_m$ lines of all the other select bits on the chip. Referring now to FIG. 4, command line 50 is then activated to connect with multiplexer 49 the FIRST$_m$ line 40 to the D flip-flop Because the COMMAND ACTIVE line 43 is on, the FIRST$_m$ value is stored in the D flip-flop 48 when clocked by line 5. The only word cell in the content-addressed memory that is then selected is the first word cell having a match. The select bits of the previously selected word cells are turned off when the multiplexer 49 connects the FIRST$_m$ line 40 and stores that value, a logic 0, in the D flip-flop 48. With READ line 47 on, only the data from the only selected word cell thus appears on the internal data bus 33.

In order to access the other word cells whose select bit was turned off with the REQUEST-FIRST command, those word cells must be reselected. Each word cell is provided with at least one match bit 31A-31K to remember, in effect, whether the word cell was previously selected or matched. By matching the match bits, the previously selected word cells may be reselected. The logic for a match bit is shown in FIG. 5. Like the select bit and the data bit, the match bit stores information in a D flip-flop 58. The 2-to-1 MUX command line 55 from the L command decode module 23 commands the 2-to-1 multiplexer 54 to connect to the D input of the D flip-flop 58 either the match BIT $M_k$ channel of internal data bus 33 or the $S_m$ line 12 from the select bit of the same word cell. After the keyword value is matched and the select bits set, the value stored in the select bit of each word cell, $S_m$, is stored in one of the match bits by selecting the $S_m$ line 12 on the multiplexer 54 and activating the STORE ENABLE $M_k$ line 71 corresponding to the match bit to store the data and clocking the $S_m$ value into the D flip-flop 58 with clock signal on line 5.

To reselect a word cell that had been selected in a previous match, all data bits and other mask bits are identified as masked data except for those storing results of the prior match or matches of interest. Appropriate data values are supplied on the match bit lines of internal data bus 33: a logic 1 if preselected word cells are to be reselected, or a logic 0 for selecting word cells not selected. The select bit is then set in the manner previously described. Therefore, given at least one match bit, at least two matches can take place without reading or writing from the selected, or unselected, cells.

Once the first word cell or record selected with the REQUEST-FIRST command is read or written to, the next word cell or record to be read or written to can be selected by writing logic 0 into the appropriate match bits of the word cell selected and reselecting the word cells as described above. The line 55 to the 2-to-1 MUX 54 connects the match bit lines of internal data bus 33 to D flip-flop 58. Turning on the STORE ENABLE $M_k$ line then permits the value on the match BIT $M_k$ line of internal data bus 33 to be clocked into, with clock signal on line 5, the D input of D flip-flop 58. The match bits can, thus, be set to the desired value with the STORE ENABLE M command and the 2-to-1 multiplexer 54 at any time. So as not to reselect a word cell, a logic 0 is written in this manner into the match bit or bits that are to be matched in the reselection process described previously. Once the other cells have been reselected, the REQUEST-FIRST command selects the first reselected cell. This process is repeated until all the word cells of interest have been accessed.

In addition to match bits serving to remember which previously selected cells were turned off by the REQUEST-FIRST command, the match bits also enable combinations of keyword values to be matched without having to read or write to the matched word cells prior to matching a new keyword value. Given a sufficient number of match bits, any keyword value combination can be matched.

To demonstrate how the keyword combinations are matched using more than one match bit, consider the task of finding the set of records satisfying the following: ((AND (A)(B)(C)) (AND (D)(E)(F)) AND) (OR (AND (G)(H)) OR (AND (I)(J)(K))), where each letter term represents a different keyword value. This expression has three levels of Boolean logic, and requires at minimum three match bits if the complete set of records is to be found without having to read the selected records and sequentially searching the read records for those with other keyword values. If the keywords corresponding to each term for one Boolean operation, A, B and C for example, are known to be located in the same word cell, keyword values A, B and C can be matched simultaneously. Only one match bit is, therefore, necessary to remember which word cells were selected. As will be seen, only K match bits will be needed to find the set of records satisfying a keyword value combination having K levels of Boolean logic. If the keywords are in different word cells, however, one additional match bit is needed to work the keyword value combination.

The first step in finding the set of records satisfying the equation above is to AND the keyword values A, B and C. If the keywords are expected to be in the same word cell, A, B and C are matched simultaneously by supplying the appropriate mask on mask lines 22, shown in FIG. 3, and data on data bus 33. Match bit $M_1$ in each selected word cell is turned on as the result of using the STORE ENABLE $M_1$ command as described above.

If the keywords A, B or C are going to be found in different word cells of the same record, each keyword value must be matched separately. An additional match bit will be required. Keyword value A is first matched. If A is not located within the first word cell of each record, the first word cell of the record in which there is contained A must be selected by using the SELECT NEXT and SELECT PREVIOUS operations, described in connection with FIG. 4. When the first word cell of the matched record is selected, the value of the select bits are then stored in match bit $M_1$ with the STORE ENABLE $M_1$ command so that $M_1$ for each selected word cell is turned on. Similarly, keyword value B is matched, with the first word cell of the matched record being selected with, if necessary, the SELECT NEXT and PREVIOUS operations. The value in the select bit is stored in match bit $M_2$ with the STORE ENABLE $M_2$ command. Next, the word cells with match bits $M_1$ and $M_2$ turned on are reselected in the manner described in connection with FIG. 5. Match bit $M_1$ in each set reselected word cell is, once again, turned on by use of the STORE ENABLE $M_1$ command.

Keyword value C is matched in an identical manner. Match bit $M_2$ is used as it was for keyword value B to remember the first word cells of the records matched with keyword value C. Finally, word cells with match bits $M_1$ and $M_2$ turned on are reselected, with match bit $M_1$ of each reselected word cell being subsequently turned on with the use of the STORE ENABLE $M_1$ command. The set of all records having keyword values A, B and C will thus be accessible or further combinable with other keyword values by reselecting all word cells with the match bit $M_1$ turned on.

To finish with the above example, the keyword values D, E and F are ANDed together in a manner similar to the ANDing of A, B and C, using match bit $M_2$ and, if necessary, match bit $M_3$, with set of records containing keyword values D, E and F having match bit $M_2$ turned on.

The OR function is carried out by selecting all word cells with match bits $M_1$ and $M_2$ turned off, storing that selection in $M_1$, thereby turning on $M_1$, selecting all word cells with $M_1$ turned off, and then storing those selections in $M_1$. All match bits $M_1$ turned on will indicate the set of all word cells satisfying the left-hand side of the equations, namely ((AND(A)(B)(C)) OR (AND(D)(E)(F)). The above outlined steps are repeated in a similar fashion for the right-hand side of the equations using match bits $M_2$, $M_3$ and, if necessary, $M_4$. The final ANDing is accomplished by selecting all word cells with $M_1$ and $M_2$ turned on. The selected word cells will, therefore, be the first word cells of the set of all records satisfying the above equation. The records can then be accessed as already described.

The match bits may also be supplied to the match bit lines of internal data bus 33 with the $READ_M$ line 42 in a manner identical to that described for the data bit. A CLEAR M line 52 is provided to clear the D flip-flop 58, as well as a RESET 45 that resets all the D flip-flops of all the bits of every word cell.

The foregoing explanation is illustrative of the functions and capabilities of the present invention. It is by no means an exhaustive discussion of the numerous ways to employ the functions inherent in the preferred embodiment of the present invention as shown in FIGS. 1-6.

The Command Decode 23, as shown in FIG. 9, receives instructions from the controller on command bus 4, decodes the command signals, and issues appropriate control signals along the command decode bus 13 to every word cell. The control lines of the command decode bus 13 are shown in FIG. 9 and are comprised of: K number of STORE ENABLE M lines 71, K being the number of match bits per word cell; READ line 47; a WRITE line 46; two 4-to-1 MUX lines 50; 2-to-1 MUX line 55; a COMMAND ACTIVE line 43; a CLEAR M line 52; a RESET line 45 to reset the entire system by restoring all bits of all cells; CLEAR S line 44 for clearing just the select bits. The functioning of these command decode lines has already been explained. The command decode module is comprised of a ROM in the preferred embodiment.

The Command Decode 23 implements the functions described above with the following commands from the controller:

1) clear all select bits;
2) clear all match bits;
3) set match bit $M_k[m]=1$ if select bit $S[m]=1$ and STORE ENABLE $M_k=1$ 4) set mask register contents;
5) select on data under mask: S[m]←(data [m,j]+input[j] or mask [j]) ANDed for all j, then ANDed with all M to all K;
6) select first word with S=1;
7) select next word (S[m]←S[m−1]);
8) select previous word (S[m]←S[m+1]);
9) write data to selected words;
10) read data from selected word (must be only one selected);
11) reset system to all zeros.
12) store enable $M_k = 1$ New commands can also be from combinations of the above commands.

The content-addressed memory chip of the present invention may be implemented using very large scale integration (VLSI) circuits or high-density CMOS circuits, possibly with multiple chips per mountable component. To store archival data, a ROM or EPROM version can be produced.

Although the invention has been described and illustrated in detail, it is to be understood that the same is by way of illustration and example only and is not to be taken by way of limitation. The spirit and scope of this invention are to be limited only by the terms of the appended claims

I claim:

1. A content-addressed memory comprising:
a plurality of word cells each comprising a plurality of bits for data storage;
means for comparing stored data in said plurality of word cells for a match with a keyboard value; and
means for selecting a first word cell adjacent to a second word cell storing data with a match to the keyword value, the first word cell storing data without a match to the keyword value related to the data having a match to the keyword value, to access data stored in the first word cell.

2. A content-addressed memory according to claim 1 wherein said means for selecting comprises means for identifying a select bit associated with respective word cells of the plurality of word cells, the select bit storing predetermined data for indicating a match between data stored in a word cell and a keyboard value, the selection of a word cell enabling data to be read from or written into said word cell.

3. A content-addressed memory according to claim 2, wherein a word cell further comprises a match data bit, identified with a corresponding select bit, for storing the select bit data.

4. A content-addressed memory according to claim 2 wherein said means for selecting further comprises means for shifting stored data of a select bit of one word cell to the select bit of a contiguous word cell.

5. A content-addressed memory according to claim 1 wherein said plurality of word cells are connected in parallel such that said means for comparing compares a keyword value to selected stored data in word cells simultaneously.

6. A content-addressed memory according to claim 1 wherein said means for selecting a first word cell further comprises means for selecting a first word cell on the basis of matching a combination of keyword values.

7. A content-addressed memory according to claim 6 wherein said means for selecting a first word cell further comprises means for signaling a match of a keyword value with stored data in a corresponding word cell by storing a predetermined data value in a select bit of the corresponding word cell, thereby enabling the data in the corresponding word cell to be assessed.

8. A content-addressed memory comprising:
a plurality of word cells each comprising a plurality of data storage bits, including a select bit and a data bit;
means for comparing a keyword value with stored data in preselected bits of each word cell and for indicating a match by storing a predetermined data value in a select bit of a matching word cell;
means for shifting data stored in a select bit of the matching word cell to a select bit of another word cell; and
means for accessing the plurality of data storage bits of a word cell of the plurality of word cells when the predetermined data value is stored in the select bit of the word cell.

9. A content-addressed memory according to claim 8 wherein each word cell further comprises a match bit for storing the data value of the select bit associated with the word cell, said match bit applied to said means for comparing such that, when the stored data in the match bit indicates a match with a keyboard value, said predetermined data value is stored in the select bit.

10. A method of reading from and writing to a record stored in a plurality of contiguous word cells of a content-addressed memory comprising the steps of:
selecting a word cell of the plurality of contiguous word cells by storing in a select bit of the word cell a predetermined data value for indicating a match between preselected data in the word cell and a keyword value;
reading or writing to the selected word cell;
shifting the predetermined data value stored in the select bit of the selected word cell to a select bit of an unselected word cell also containing part of the record to thereby select the unselected word cell; and
reading or writing to the newly selected word cell.

11. A method of storing and accessing data in a content-addressed memory having a plurality of word cells, comprising the steps of:
storing a data record in a plurality of contiguous word cells;
selecting all word cells storing data matching a keyword value; and
accessing a record containing the data matching the keyword value by selecting contiguous word cells containing other parts of the record and accessing all word cells selected in the step of selecting all word cells storing data matching a keyword value.

12. A method for storing and accessing data as described in claim 11 wherein said step of selecting all word cells further includes the step of selecting all word cells storing data matching a combination of keyword values.

13. A method for storing and accessing data as described in claim 12 wherein said step of selecting all word cells storing data matching a combination of keyword values further comprises the steps of:
for each keyword value, selecting all word cells storing data matching the keyword value and storing a predetermined data value in one or more match bits associated with the selected word cells; and
reselecting and sequentially accessing word cells with match bits storing the predetermined data value.

* * * * *